(12) United States Patent
Hoogzaad et al.

(10) Patent No.: US 9,419,563 B2
(45) Date of Patent: Aug. 16, 2016

(54) RF AMPLIFIER

(71) Applicant: NXP B.V., Eindhoven (NL)

(72) Inventors: Gian Hoogzaad, Mook (NL);
Alexander Simin, Nijmegen (NL);
Hasan Gui, Lent (NL)

(73) Assignee: NXP B.V., Eindhoven (NL)

( * ) Notice: Subject to any disclaimer, the term of this patent is extended or adjusted under 35 U.S.C. 154(b) by 1 day.

(21) Appl. No.: 14/527,968

(22) Filed: Oct. 30, 2014

(65) Prior Publication Data

US 2015/0123732 A1    May 7, 2015

(30) Foreign Application Priority Data

Nov. 1, 2013  (EP) .................................... 13191286

(51) Int. Cl.
| H03F 3/191 | (2006.01) |
|---|---|
| H03F 1/26 | (2006.01) |
| H03F 1/22 | (2006.01) |
| H03F 3/50 | (2006.01) |
| H03F 3/193 | (2006.01) |
| H04W 88/08 | (2009.01) |

(52) U.S. Cl.
CPC .. H03F 1/26 (2013.01); H03F 1/22 (2013.01); H03F 1/226 (2013.01); H03F 3/191 (2013.01); H03F 3/193 (2013.01); H03F 3/50 (2013.01); *H03F 2200/294* (2013.01); *H03F 2200/451* (2013.01); *H04W 88/08* (2013.01)

(58) Field of Classification Search
CPC .................... H03F 2200/489; H03F 2200/492; H03F 3/191

USPC .......................................... 330/283, 302, 311
See application file for complete search history.

(56) References Cited

U.S. PATENT DOCUMENTS

| 3,835,411 A | * | 9/1974 | Carleson | ................. | H04B 3/145 |
|---|---|---|---|---|---|
| | | | | | 330/176 |
| 5,646,578 A | * | 7/1997 | Loh | ...................... | H03G 3/3047 |
| | | | | | 330/279 |
| 2005/0176399 A1 | * | 8/2005 | Aparin | .................... | H03F 1/223 |
| | | | | | 455/341 |
| 2006/0132242 A1 | | 6/2006 | Han et al. | | |
| 2006/0170502 A1 | | 8/2006 | Cha et al. | | |

FOREIGN PATENT DOCUMENTS

| EP | 2 253 444 A2 | 11/2010 |
|---|---|---|
| JP | 05 308229 A | 11/1993 |

OTHER PUBLICATIONS

Song, Nam Jin et al; "SiGe Front-end Transceiver Components for 802.11 a WLAN Applications"; IEEE Radio Frequency Integrated Circuits Symposium, Texas, US; IEEE Piscataway, NJ, USA; pp. 527-530 (Jun. 6, 2004).

(Continued)

*Primary Examiner* — Steven J Mottola

(57) ABSTRACT

A two-stage RF amplifier is provided. The first stage is a common-emitter transistor arrangement with a purely reactive degeneration impedance and an output impedance with a reactive component matched in frequency response to the degeneration impedance. The second stage is a buffer amplifier. The first amplifier can be designed for high gain which is flat over frequency by virtue of the reactive degeneration impedance. The first amplifier provides input matching, and the buffer provides output matching, with decoupling between the input and output.

12 Claims, 3 Drawing Sheets

(56) References Cited

OTHER PUBLICATIONS

Chen, Wu-Hsin, et al; "A 6-Gb/S Wireless Inter-Chip Data Link Using 43-GHz Transceivers and Bond-Wire Antennas"; IEEE Journal of Solid State circuits, vol. 44, No. 10; pp. 2711-2721 (Oct. 2009).
Liu, Mingxu et al; "A 6.5-k-V ESD-Protected 3-5-GHz Ultra-Wideband BiCMOS Low-Noise Amplifier Using Interstage Gain Roll-Off Compensation"; IEEE Transactions on Microwave Theory and Techniques, vol. 54, No. 4; pp. 1698-1706 (Apr. 2006).
Floyd, Brian A. et al; "A 15-GHz Wireless Interconnect Implemented in a 0.18μm CMOS Technology Using Integrated Transmitters, Receivers, and Antennas"; 2001 Symposium on VLSI Circuits Digest of Technical Papers, Kyoto, Japan; pp. 155-158 (Jun. 14, 2001).
Sun, Ming-Chang, et al; "A One-Step Input Matching Method for Cascode CMOS Low-Noise Amplifiers"; IEICE Trans. Electron Institute of Electronics, Tokyo, JP, vol. E88-C, No. 3; pp. 420-428 (Mar. 2005).
Balemarthy, Deepak et al; "A 1.6/1.8/2.1/2.4-GHz Multiband CMOS Low Noise Amplifier"; IETE Journal of Research, vol. 54, No. 2; downloaded from the internet http://www.jr.ietejournals.org Jul. 1, 2010; pp. 97-104 (Mar.-Apr. 2008).
Shah, Peter et al; "A 2GHz Low-Distortion Low-Noise Two-Stage LNA Employing Low-Impedance Bias Terminations and Optimum Inter-Stage Match for Linearity"; Solid-State Circuts Conference 2000; Stockholm, Sweden Sep. 19-21, 2000; IEEE, Piscataway, NJ, USA; pp. 308-311 (Sep. 19, 2000).
Extended European Search Report for appln. No. 13191286.7 (Mar. 19, 2014).

* cited by examiner

RF AMPLIFIER

CROSS-REFERENCE TO RELATED APPLICATIONS

This application claims the priority under 35 U.S.C. §119 of European patent application no. 13191286.7, filed on Nov. 1, 2013, the contents of which are incorporated by reference herein.

The invention relates to RF amplifiers.

There is a growing need for wideband variable gain amplifiers ("VGAs") and wideband low noise amplifiers ("LNAs"). For example, there is a need for such amplifiers in cellular base stations.

The need for these amplifiers is motivated by two developments: increasing small-cell base station deployment; and reuse of the same IC for various platforms, cellular standards and bands and wideband applications. This reuse of a smaller number of different ICs for many different base station applications reduces costs, in particular support costs.

In general, LNAs and receiver VGAs designed for macro base stations are narrow-band designs typically achieving an input/output impedance match over a range of about 100 MHz at RF frequencies within the range 600 MHz to 3.8 GHz.

The advantage of these known narrow-band designs is that reactive components (inductors and capacitors) can predominantly be used in order to obtain the required noise performance. These inductors and capacitors do not generate noise, so a low noise figure ("NF") can be achieved which is key for base station receivers.

There is now a need for a LNA with good input and output return loss (S11 and S22<−15 dB) in a bandwidth from 600 MHz to 3.8 GHz still with very good noise figure, such as <1 dB, including at elevated ambient temperatures.

However, this broadband low-noise functionality needs to be achieved with the use of a minimal number of noisy components, in combination with a minimal impact of the noise generated by noisy components which cannot be avoided. For example, a transistor is unavoidable in order to provide gain, and a resistor is unavoidable to provide a broadband match at the input and output.

The invention is defined by the claims.

According to the invention, there is provided an RF amplifier, comprising:

an input amplifier comprising a transistor arrangement, an output impedance arrangement, a degeneration impedance arrangement to provide degeneration, and a feedback impedance arrangement, wherein the degeneration impedance is purely reactive and the output impedance arrangement comprises a purely reactive arrangement matched in frequency behaviour to the degeneration impedance arrangement; and a buffer amplifier having as input the output of the input amplifier and providing the RF amplifier output.

Note that by "purely reactive" is meant that the circuit elements used are intended to be purely capacitive or inductive. Of course, all such components have parasitic resistance, and the term "purely reactive" it is not intended to imply any special measures to reduce such parasitic non-reactive impedance contributions. Matched in frequency behaviour means that the impedance value has the same variation with frequency, so that a ratio of impedances (which determines the gain) remains substantially constant over frequency. This can be achieved by using components or circuit arrangements which are scaled versions of each other.

This arrangement has a first-stage amplifier which preferably aims to achieve large and constant voltage gain over a wide frequency range (as opposed to a moderate amount of power gain in a narrow band). This is achieved by implementing a reactive degeneration impedance and a reactive output impedance of the same type, so that the impedance ratio of degeneration and output impedances can predominantly be frequency independent. A second-stage buffer is for minimally loading the first stage and recreates the RF power at any desired impedance level at its output.

The invention enables a broadband impedance match to be achieved with reduced impact on the noise figure. Improved LNA isolation is obtained, which enables simultaneous good input and output impedance match. A dependence of various parameters on package inductance can also be reduced.

The voltage gain of the input amplifier is preferably at least 20 dB, more preferably at least 25 dB, for example in the range 25 dB to 40 dB.

The transistor arrangement of the input amplifier can comprise a common-emitter configuration, with the output impedance arrangement connected to the collector and the degeneration impedance arrangement connected to the emitter. It can be a single transistor. However, a preferred common-emitter transistor arrangement comprises first and second transistors with their collector-emitter paths in series, wherein the first has the RF input signal applied to its base and the second has a bias voltage applied to its base. A third transistor can be provided with its collector-emitter path connected between the collector and base of the first transistor. This functions as a Darlington transistor.

The degeneration impedance arrangement preferably comprises an inductor.

To make the gain as high as possible, this inductance should be as low as possible. At the limit, the degeneration impedance arrangement can comprise only inductances defined by package to ground connections. This avoids the need for additional components. However, the degeneration impedance arrangement can comprise a dedicated circuit element.

The output impedance arrangement preferably also comprises an inductor. The inductors of the output impedance arrangement and the degeneration impedance arrangement have similar frequency dependency, so that the gain is largely frequency-independent.

The inductor of the output impedance arrangement can have an output tap between the ends of the inductor, and the first amplifier output comprises the output tap. This provides a way to implement gain limitation.

The output impedance arrangement can further comprise a resistor. There is then a trade-off between the noise introduced by the resistor and an improved flattening of the gain at lower frequencies.

The buffer amplifier can for example comprise a buffer transistor, a current source for controlling the emitter current of the buffer transistor, and a matching impedance at the output for providing output impedance matching. This defines a basic buffer configuration, although other more complicated buffer circuits are possible.

The invention also provides a variable gain amplifier comprising an input amplifier which comprises an RF amplifier of the invention, a digital step attenuator and an output amplifier.

The invention also provides a mobile telephony base station RF amplifier circuit, comprising an RF amplifier and/or a variable gain amplifier of the invention.

The invention also provides an RF amplification method, comprising:

providing constant voltage gain amplification of an RF input using an RF amplifier having a purely reactive degeneration impedance arrangement and an output impedance arrangement comprising a purely reactive arrangement matched in frequency behaviour to the degeneration impedance arrangement; and buffering the constant voltage gain amplified signal.

BRIEF DESCRIPTION OF DRAWINGS

Examples of the invention will now be described in detail with reference to the accompanying drawings, in which.

The invention provides a two-stage RF amplifier. The first stage is a transistor arrangement with a purely reactive degeneration impedance and output impedance with a reactive component with the same frequency behavior. The second stage is a buffer amplifier. The first amplifier can be designed for high gain which is flat over frequency by virtue of the ratio of reactive degeneration impedance and reactive output impedance. The first amplifier provides input matching, and the buffer provides output matching, with decoupling between the input and output.

The figures all show small signal circuit diagrams, i.e. RF-functional circuit diagrams which omit DC elements such as bias circuits and DC block capacitors.

Figure 1:
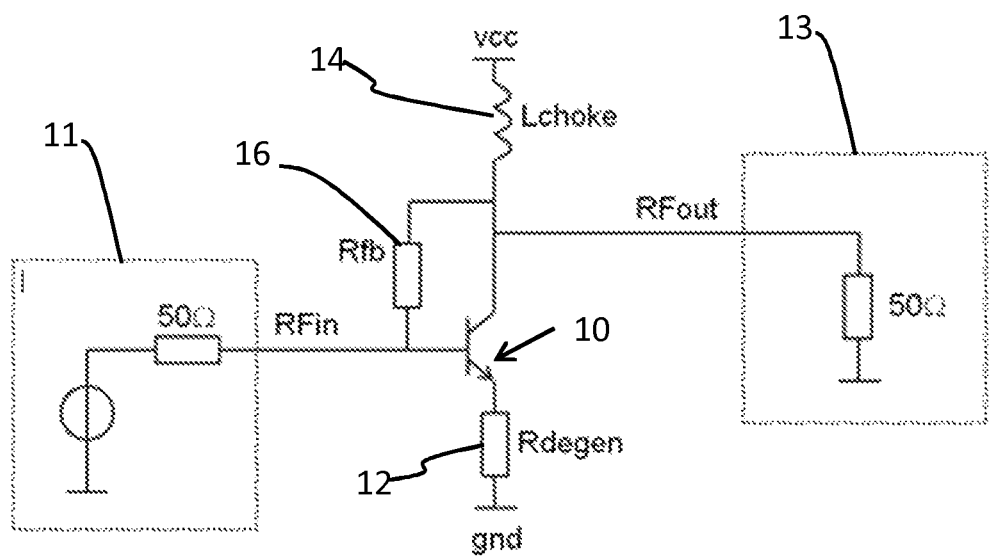
FIG. 1 shows a well-known shunt-series amplifier.

FIG. 1 shows a well-known shunt-series amplifier. It comprises an RF transistor 10, with the RF input from the RF source 11 coupled to the base. Note that implementations are possible with multiple transistors.

The emitter is connected to ground through a "degeneration resistor" 12, and the collector (which is the circuit output to the RF load 13) is coupled to the high voltage rail vcc through an inductor 14. A feedback resistor is provided between the collector and base. This circuit can achieve joint input and output impedance match when the degeneration resistor Rdegen and feedback Rfb resistor are properly dimensioned.

As mentioned above, DC components are omitted. By way of example, DC blocking capacitors are typically provided in series with the RF source, feedback resistor and RF load.

The RF source 11 drives RF power into the amplifier at typically 50Ω impedance, although this can be different. The RF load 13 is also typically 50Ω but again this can be different.

The inductor 14 is an RF choke.

The voltage gain G of the amplifier is defined by the ratio of the load resistor and the degeneration resistor, so by way of example Rdegen=5Ω gives approximately 10 times gain (=20 dB). Input and output matching is achieved when the feedback resistor is approximately (G+1) times larger than the load, i.e. the source resistor. This gives Rfb=550Ω.

This topology has three disadvantages:

(i) the amplifier has two dominant noise contributors: the degeneration and feedback resistors. In addition to these dominant contributors, the transistor 10 also adds noise.

(ii) isolation is limited to a few dB more than the gain, indicating that input and output influence each other considerably (i.e. amplifier is not unilateral).

(iii) the ground node "gnd" practically has a ground inductance (for example derived from IC tracks, bondwires, PCB vias) which increases the degeneration impedance at higher frequencies. This makes the gain dependant on frequency and therefore deteriorates bandwidth of the application. Moreover, input and output matching are also deteriorated with higher frequency. Both the frequency-dependent gain and impaired return losses are disadvantageous.

Figure 2:
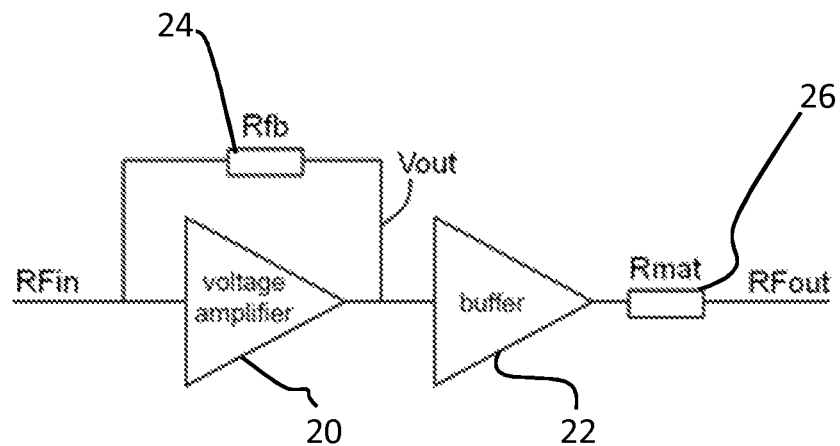
FIG. 2 shows an example of amplifier arrangement of the invention at a block level.

FIG. 2 shows the amplifier arrangement of the invention at a block level, and shows an LNA topology.

The aim is to implement a voltage gain from the input node RFin to the output node Vout which is as large and constant as possible.

The circuit comprises a first-stage amplifier 20 (which is an active transistor-based circuit) that aims to achieve large and constant voltage gain over a wide frequency range. A second-stage buffer 22 is also a transistor based circuit, and it provides minimal loading to the first stage. The buffer recreates the RF power at any desired impedance level at its output. The first stage amplifier has a resistive feedback 24 (Rfb) and a matching resistor 26 (Rmat) is provided at the output of the second stage buffer 22.

Since input matching is achieved when Rfb equals (G+1) times the RF source impedance (=50Ω), a large voltage gain in the first amplifier means that Rfb is maximised, which thereby minimizes its noise contribution. This wideband voltage gain can be made without a degeneration resistor but using a reactive component instead, thereby completely removing this resistive noise contributor, by means of noise-free reactive components.

In principle, since gain is still determined by the ratio of components, any reactive component with similar frequency dependence can be used to make the voltage gain frequency-independent.

Figure 3:
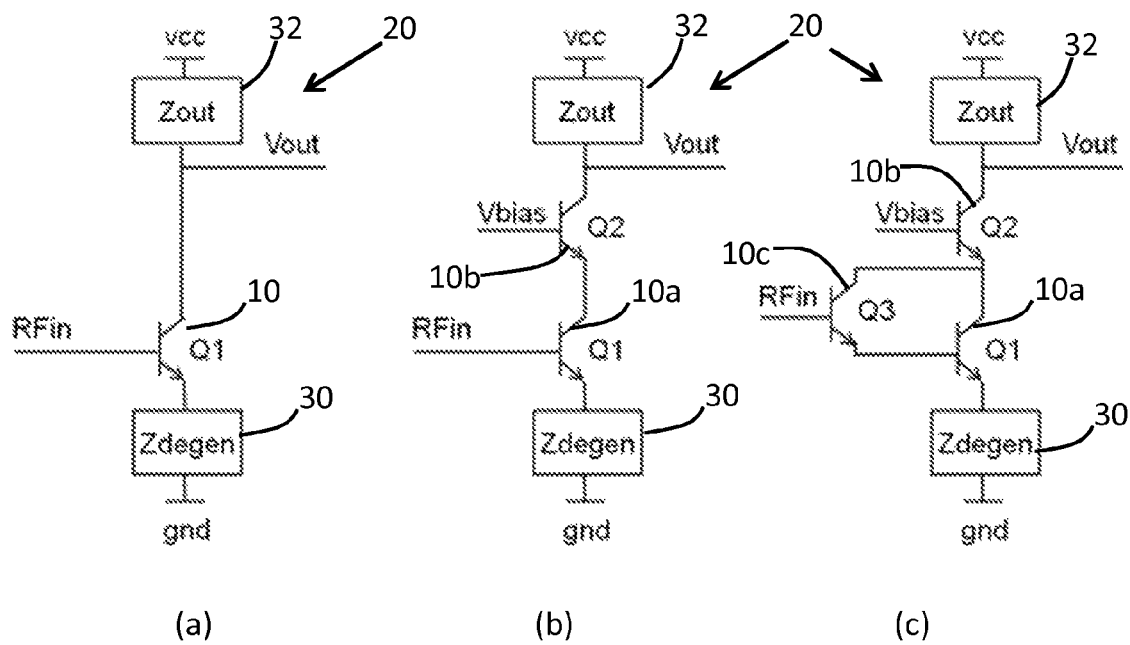
FIG. 3 shows three examples of possible first stage voltage amplifier.

FIG. 3 shows three examples of possible first stage voltage amplifier 20.

FIG. 3(a) shows a RF transistor 10 (also identified as Q1) with its emitter coupled to ground through a purely reactive degeneration component 30 (Zdegen), with an output impedance 32 (Zout) between the collector and the supply rail vcc. The feedback resistor is not shown, for consistency with FIG. 2, where it is shown external to the amplifier block 20. The output impedance can be purely reactive but it may also have a resistive component (as will be discussed below).

FIG. 3(b) shows a first RF transistor 10a (also identified as Q1) with its emitter coupled to ground through a purely reactive degeneration component 30 (Zdegen). A second transistor 10b (also identified as Q2) is in series with the first, with the emitter of the second transistor connected to the collector of the first transistor. This functions as a common base cascode transistor. The output impedance 32 (Zout) is between the collector of the second transistor 10b and the supply rail vcc. This second transistor is biased by a bias voltage Vbias applied to its base. Again, the feedback resistor is not shown, for consistency with FIG. 2.

FIG. 3(c) shows a modification to FIG. 3(b) in which the first power transistor 10a (Q1) is replaced with a Darlington pair, comprising the main power amplifier transistor 10a (Q1) and a Darlington transistor 10c (also identified as Q3).

Practical reactive components for the degeneration and output impedances are inductors or capacitors or any combination thereof. The components are chosen to achieve a sufficiently similar frequency behaviour to give rise to a voltage gain which is sufficiently flat over frequency.

Thus, the circuits of FIG. 3 enable a frequency-independent voltage gain to be achieved, based on the ratio of Zout and Zdegen.

Consequently Zout and Zdegen are preferably implemented with scaled components, which are thereby well-matched in terms of frequency behaviour.

The implementation of FIG. 3(b) with two transistors is preferred, since the extra common-base cascode transistor 10b enables larger supply voltages for vcc (the voltage "stress" vcc is split between 10a and 10b). This also prevents undesired input-to-output feedback from the collector-base capacitance of transistor 10a.

The implementation with a Darlington transistor 10c can be beneficial when the base current shot noise of the main transistor 10a is too dominant.

Figure 4:
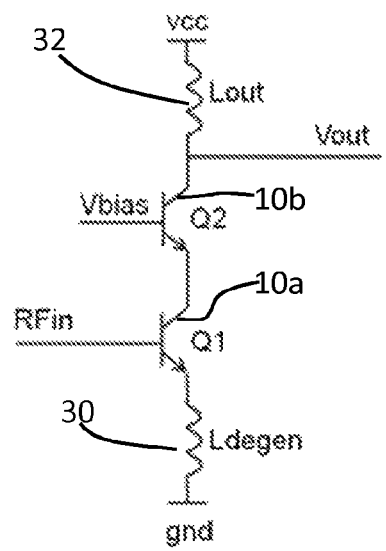
FIG. 4 shows one preferred example of implementation of the first amplifier.

FIG. 4 shows one example of implementation of the first amplifier 20, based on the circuit of FIG. 3(b) with purely inductive components for the degeneration impedance 30 (Ldegen) and output impedance 32 (Lout).

Series inductance to the ground cannot be prevented. The circuit of FIG. 4 does not experience this inductance as an undesirable parasitic, but makes use of it as part of the impedance matching function. Especially when this inductance stems mainly from bondwires, leadframe and PCB, it has low series resistance. This means it has higher quality factor than on-chip inductors, so it adds less noise compared to an on-chip inductor. A further benefit of the circuit of FIG. 4 is that little additional biasing circuitry is needed, because the inductors can also carry the DC current required for the transistors.

Maximization of the voltage gain (for lowest noise figure) is achieved by minimizing the degeneration inductance Ldegen and maximizing the output inductance Lout.

The practical limit for a minimal value of the degeneration inductance value Ldegen is usually determined by the package ground inductance when track lengths on the IC are minimized. This package to ground inductance can be used to define the degeneration inductor. However, if production tolerances of this package inductance are too large, then this may necessitate the addition of an on-chip inductor to implement Ldegen as well. On-chip inductors can easily be manufactured with tightly controlled inductance values.

The practical limit for maximal Lout is determined by the self-resonance frequency. This frequency is preferred to be far out-of-band for reasons of gain-peaking and stability. Nevertheless, it can be imagined that the self-resonance behaviour of Lout is designed to be matched by the resonance behaviour of Ldegen: this derives from the aim of achieving constant Zout/Zdegen ratio. The benefit in this case is that it will extend the frequency-independent gain even further.

Based on the practical considerations described above, a practical example for the voltage gain is in the range 25 dB-40 dB, and therefore well in excess of typical required values of 15 dB-20 dB. This means that some gain reduction is required.

Figure 5:
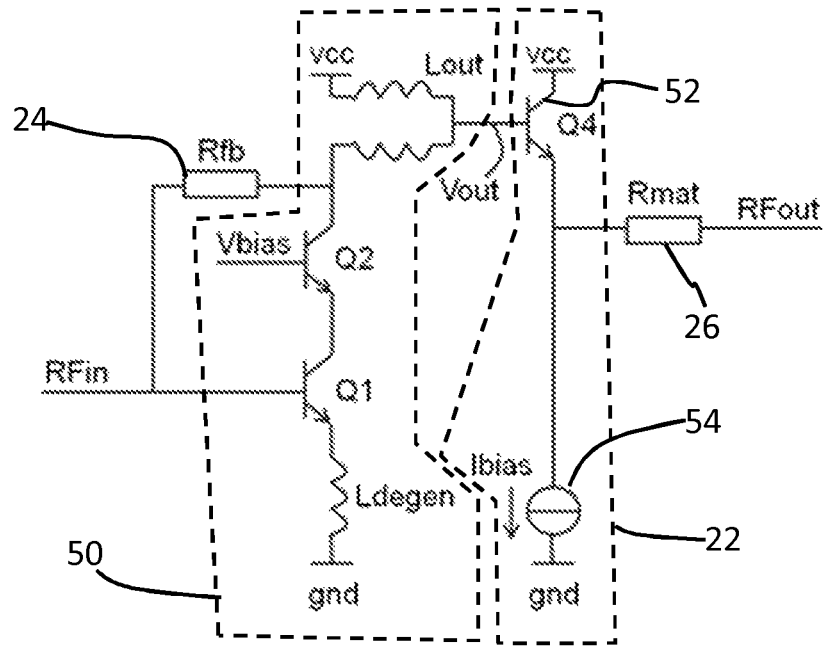
FIG. 5 shows an example of complete input and output matched LNA of the invention.

FIG. 5 shows an example of complete input and output matched LNA, and which is used to explain two possible ways to achieve gain reduction.

The circuit of FIG. 5 comprises the circuit of FIG. 4, shown as block 50. However, a tap has been provided from the output inductor, so that it is effectively divided into two series components, and the output is taken from the junction between them.

The buffer 22 is shown as an output transistor 52 (also identified as Q4) with a collector-emitter current set by a bias current source 54. The collector connects to the high voltage line vcc and the emitter connects to the bias current source. The output voltage of the first stage amplifier 50 is provided to the base, and the output is taken from the emitter.

The tapped inductor provides a first gain reduction technique. It can be a center tap. Using a tap means the gain reduction necessary for further RF power processing is implemented by a noise-free voltage division.

A second gain reduction is implemented inherently in the buffer 22. Its output impedance 1/gm is, with typical bias currents Ibias necessary for linearity, too small to directly connect to an RF load impedance of e.g. 50Ω. This load impedance can for example be an on-chip digital step attenuator ("DSA") designed at 50Ω.

In this case it is even better for overall noise performance to design the DSA impedance at e.g. 25Ω, but also then the output matching resistor 26 (Rmat) can be added (as also shown in FIG. 2). Rmat together with the matched load impedance give a 6 dB gain reduction.

FIG. 5 shows that the isolation disadvantage of the prior art of FIG. 1 is solved, because the buffer separates the input from the output. This makes the LNA highly unilateral with the benefit of being able to separately optimize input and output return loss for wideband operation.

The buffer in FIG. 5 is a most straightforward implementation, based on an emitter follower. Other implementations are possible of course, with feedback or making the current source RF signal-dependent.

A further refinement of the invention is to include extra resistance in the output impedance 32 (Zout). Inevitably, the degeneration impedance 30 (Zdegen), and therefore the transfer gain, includes 1/gm of the input transistor 10a. By including G times 1/gm in the output impedance Zout (e.g. a resistor G/gm in series with Lout), the gain becomes more flat also at frequencies below 1/(gm·Ldegen). This helps achieving good input return loss at the lower end of the wideband, but with a (minor) noise penalty.

This additional output resistor thus compensates for the inherent resistor of the transistor, which can be seen as a resistor in series with the degeneration impedance. Thus, the aim is again to match the frequency characteristics of the output impedance with the effective impedance of the degeneration impedance arrangement (if also taking into account the transistor resistance).

The amplifier is of particular interest for wideband variable gain amplifiers (VGAs).

Figure 6:
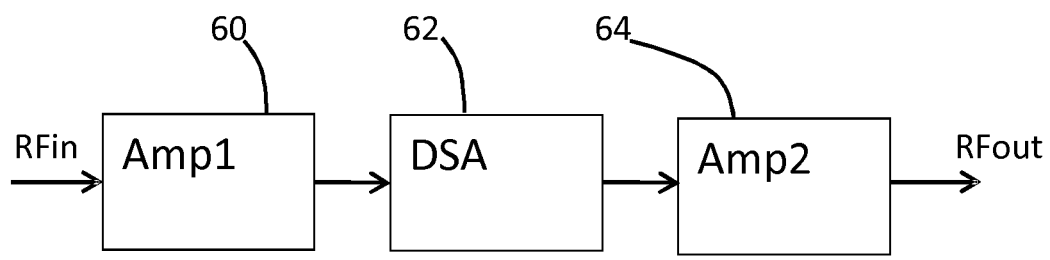
FIG. 6 shows a variable gain amplifier using the RF amplifier of the invention.

As shown in FIG. 6, this variable gain amplifier can for example comprise an input amplifier 60, a digital step attenuator 62, and an output amplifier 64. The wideband LNA can then be used as the input amplifier.

The digital step attenuator has inherently good wideband behaviour when build with passive pi-sections. The output amplifier is typically not implemented using an LNA topology, but is more optimized for linearity (IP3 and P1 dB compression) and/or power efficiency.

In a typical VGA, functionality is present to bypass the input amplifier. This is used when the input signal is large. This bypass switch across the input amplifier can be combined with the wideband LNA of this invention.

The invention can be used in a variety of applications where wideband operation is required (both good wideband return losses and limited gain variation over frequency) in combination with low noise performance.

Macro and small-cell base station receivers are only one set of examples in which the invention is of interest. For example, the invention may find application in high-band 5 GHz systems and low-band 2.4 GHz WLAN.

The examples above are all based on bipolar junction transistors. However, circuits with the same functionality can be implemented with field effect transistors. CMOS, GaAs, pHEMT technologies can for example be used.

The examples of amplifier circuit given are also all common-emitter circuits. The equivalent FET circuit is a common-source amplifier. Thus, the connections shown to collector, base and emitter can be converted to drain, gate and source connections for an FET implementation. The amplifiers may be implemented using other circuit configurations than those shown.

It will be clear from the above description that the main purpose of the input amplifier is to provide a flat gain by having the frequency dependency of the degeneration impedance the same as for the output impedance. This can be achieved by having corresponding configurations of capacitors and/or inductors. There may be one inductor, and arrangement of multiple inductors, one capacitor, and arrangement of multiple capacitors, or a combination of capacitors and inductors.

However, as will be clear from the examples above, there can also be some fine tuning of the frequency response, for example with a resistor as part of the output impedance. This can be considered as a fine tuning element, and the main components of the output impedance are again purely reactive and match the frequency characteristics of the purely reactive degeneration impedance. Thus, where it is stated that the output impedance arrangement "comprises a purely reactive arrangement matched in frequency behaviour to the degeneration impedance arrangement" this does not exclude other fine tuning components such as the resistor in the example above which is used to mirror the transistor resistance. For the examples above, the output impedance arrangement is purely reactive and matched in frequency behaviour to the degeneration impedance arrangement, but there is an optional additional series resistance.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. An RF amplifier, comprising:
    an input amplifier comprising:
    a transistor arrangement;
    an output impedance arrangement;
    a degeneration impedance arrangement to provide degeneration; and
    a feedback impedance arrangement,
    wherein the degeneration impedance arrangement is purely reactive and the output impedance arrangement comprises a purely reactive arrangement matched in frequency behaviour to the degeneration impedance arrangement; and
    a buffer amplifier having as input the output of the input amplifier (20) and providing the RF amplifier output;
    wherein the degeneration impedance arrangement and output impedance arrangement comprise inductors;
    wherein the inductor of the output impedance arrangement has an output tap between the ends of the inductor, and the first amplifier output comprises the output tap such that the buffer amplifier is connected to the input amplifier at the output tap.

2. An RF amplifier as claimed in claim 1, wherein the voltage gain of the input amplifier is at least 20 dB, and more preferably in the range 25 dB to 40 dB.

3. An amplifier as claimed in claim 1, wherein the transistor arrangement comprises a common-emitter configuration, with the output impedance arrangement connected to the collector and the degeneration impedance arrangement connected to the emitter.

4. An RF amplifier as claimed in claim 3, wherein the common-emitter transistor arrangement comprises a single transistor.

5. An RF amplifier as claimed in claim 3, wherein the common-emitter transistor arrangement comprises first and second transistors with their collector-emitter paths in series, wherein the first has the RF input signal applied to its base and the second has a bias voltage applied to its base.

6. An RF amplifier as claimed in claim 5, wherein the common-emitter transistor arrangement further comprises a third transistor with its collector-emitter path connected between the collector and base of the first transistor.

7. An RF amplifier as claimed in claim 1, wherein the degeneration impedance arrangement comprises only inductances defined by package to ground connections.

8. An RF amplifier as claimed in claim 1, wherein the degeneration impedance arrangement comprises a dedicated circuit element.

9. An RF amplifier as claimed in claim 1, wherein the buffer amplifier comprises a buffer transistor, a current source for controlling the emitter current of the buffer transistor, and a matching impedance at the output for providing output impedance matching.

10. A variable gain amplifier comprising an input amplifier which comprises an RF amplifier as claimed in claim 1, a digital step attenuator, and an output amplifier.

11. A mobile telephony base station RF amplifier circuit, comprising an RF amplifier as claimed in claim 1.

12. An RF amplification method, comprising:
    providing constant voltage gain amplification of an RF input using an RF amplifier having a purely reactive degeneration impedance arrangement and an output impedance arrangement comprising a purely reactive arrangement matched in frequency behaviour to the degeneration impedance arrangement; and
    buffering the constant voltage gain amplified signal;
    wherein the degeneration impedance arrangement and output impedance arrangement comprise inductors;
    wherein the inductor of the output impedance arrangement has an output tap between the ends of the inductor, and the first amplifier output comprises the output tap such that the buffer amplifier is connected to the input amplifier at the output tap.

* * * * *